US009546901B2

(12) United States Patent
Senekerimyan et al.

(10) Patent No.: US 9,546,901 B2
(45) Date of Patent: Jan. 17, 2017

(54) MINIMIZING GRAZING INCIDENCE REFLECTIONS FOR RELIABLE EUV POWER MEASUREMENTS HAVING A LIGHT SOURCE COMPRISING PLURAL TUBES WITH CENTERLINES DISPOSED BETWEEN A RADIATION REGION AND CORRESPONDING PHOTODETECTOR MODULES

(71) Applicant: ASML Netherlands B.V., Veldhoven (NL)

(72) Inventors: Vahan A. Senekerimyan, San Diego, CA (US); Michael A. Purvis, San Diego, CA (US); Jie L. Ding, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 22 days.

(21) Appl. No.: 14/463,605

(22) Filed: Aug. 19, 2014

(65) Prior Publication Data

US 2016/0054174 A1    Feb. 25, 2016

(51) Int. Cl.
*G01J 1/42* (2006.01)
*G01T 1/16* (2006.01)
(Continued)

(52) U.S. Cl.
CPC ............. *G01J 1/42* (2013.01); *G01J 1/0214* (2013.01); *G01J 1/0414* (2013.01); *G01J 1/06* (2013.01);
(Continued)

(58) Field of Classification Search
CPC ..... A61L 2/14; G01N 15/1459; G01N 21/553; G01J 1/42; G01J 1/429; G01T 1/16; H05G 2/008; H05G 2/003; H05G 2/001; G03F 7/70033
(Continued)

(56) References Cited

U.S. PATENT DOCUMENTS 7,154,101 B2    12/2006 Panning
7,372,056 B2    5/2008 Bykanov et al.
(Continued)

FOREIGN PATENT DOCUMENTS

WO    2011/029467 A1    3/2011

*Primary Examiner* — Que T Le
(74) *Attorney, Agent, or Firm* — Martine Penilla Group, LLP

(57) ABSTRACT

A light source includes a light generating chamber and a collector disposed in the light generating chamber. A target material generator configured to propel a quantity of target material toward an irradiation region is disposed in front of a reflective surface of the collector. A plurality of photodetector modules is disposed external to the light generating chamber, with each of the photodetector modules being directed toward the irradiation region. A plurality of tubes is disposed between a corresponding photodetector module and the irradiation region. Each tube has a centerline directed toward the irradiation region, and each tube has a roughened inner surface. The surface roughness of the roughened inner surface is sufficient to cause grazing incidences of light to be eliminated rather than to be reflected off the roughened inner surface. A method of generating light and a method of measuring light energy also are described.

21 Claims, 8 Drawing Sheets

(51) Int. Cl.
*G03F 7/00* (2006.01)
*G03F 7/20* (2006.01)
*G01J 1/04* (2006.01)
*G01J 1/06* (2006.01)
*G01J 1/02* (2006.01)

(52) U.S. Cl.
CPC .............. *G01J 1/429* (2013.01); *G01T 1/16* (2013.01); *G03F 7/00* (2013.01); *G03F 7/70008* (2013.01); *G03F 7/70033* (2013.01); *G03F 7/7085* (2013.01)

(58) Field of Classification Search
USPC .. 250/221, 573–576, 205, 239, 216; 356/73, 356/36–42, 244–246, 436
See application file for complete search history.

(56) References Cited

U.S. PATENT DOCUMENTS

| | | | |
|---|---|---|---|
| 8,159,658 B2* | 4/2012 | Durrer | G01N 21/272 356/244 |
| 8,246,182 B2 | 8/2012 | Von Blanckenhagen | |
| 8,519,366 B2 | 8/2013 | Bykanov et al. | |
| 2012/0140328 A1 | 6/2012 | Kwan | |

* cited by examiner

MINIMIZING GRAZING INCIDENCE REFLECTIONS FOR RELIABLE EUV POWER MEASUREMENTS HAVING A LIGHT SOURCE COMPRISING PLURAL TUBES WITH CENTERLINES DISPOSED BETWEEN A RADIATION REGION AND CORRESPONDING PHOTODETECTOR MODULES

BACKGROUND

Extreme ultraviolet (EUV) light is used in applications such as extreme ultraviolet lithography (EUVL). The extreme ultraviolet (EUV) light may be generated using an EUV source in which a target material is irradiated by a laser source. The irradiation of the target material by a high power laser source leads to the generation of plasma which emits EUV light. A collector situated in a vessel focuses the photons of the plasma so that the photons are directed out of the vessel and into an EUV consuming system such as an extreme ultraviolet lithography system (EUVL).

To monitor the generation process, EUV sensors can be used to measure the energy of the EUV light. In vessels provided with multiple EUV sensors, significant EUV energy discrepancies have been observed between the multiple EUV sensors.

It is in this context that embodiments arise.

SUMMARY

In an example embodiment, a light source is provided. The light source includes a light generating chamber in which a collector having a reflective surface is disposed. A target material generator configured to propel a quantity of target material toward an irradiation region is disposed in front of the reflective surface of the collector. A plurality of photodetector modules is disposed external to the light generating chamber, with each of the plurality of photodetector modules being directed toward the irradiation region. A plurality of tubes is disposed between a corresponding photodetector module and the irradiation region. Each of the tubes has a centerline directed toward the irradiation region, and each of the tubes has a roughened inner surface.

In one example embodiment, the light generating chamber is configured to generate extreme ultraviolet (EUV) light. In one example embodiment, the roughened inner surface of each of the plurality of tubes has a surface roughness sufficient to cause grazing incidences of light to be eliminated rather than to be reflected off the roughened inner surface.

In one example embodiment, the inner surface of each of the plurality of tubes is roughened by bead blasting the inner surface of each of the plurality of tubes, and threading the bead-blasted inner surface of each of the plurality of tubes.

In one example embodiment, the roughened inner surface of each of the plurality of tubes has a surface roughness in a range from about 20 microns to about 1 millimeter. In another example embodiment, the roughened inner surface of each of the plurality of tubes has a surface roughness in a range from about 100 microns to about 0.5 millimeter. In yet another example embodiment, the roughened inner surface of each of the plurality of tubes has a surface roughness in a range from about 200 microns to about 0.1 millimeter.

In another example embodiment, a method is provided. The method includes generating light in a light generating chamber, causing a portion of the generated light to pass through a tube having a roughened inner surface, detecting the portion of the generated light that has passed through the tube using a photodetector, and outputting a signal from the photodetector to a controller, with the signal corresponding to the detected portion of the generated light.

In one example embodiment, the generating of light in the light generating chamber generates extreme ultraviolet (EUV) light. In one example embodiment, the roughened inner surface of the tube has a surface roughness sufficient to cause grazing incidences of light to be eliminated rather than to be reflected off the roughened inner surface. In one example embodiment, the inner surface of the tube is roughened by bead blasting the inner surface of the tube, and threading the bead-blasted inner surface of the tube.

In one example embodiment, the roughened inner surface of the tube has a surface roughness in a range from about 20 microns to about 1 millimeter. In another example embodiment, the roughened inner surface of the tube has a surface roughness in a range from about 100 microns to about 0.5 millimeter. In yet another example embodiment, the roughened inner surface of the tube has a surface roughness in a range from about 200 microns to about 0.1 millimeter.

In yet another example embodiment, another method is provided. This method includes generating light in a light generating chamber, causing a portion of the generated light to pass through a tube having a roughened inner surface, and detecting the portion of the generated light that has passed through the tube using a photodetector.

In one example embodiment, the generating of light in the light generating chamber generates extreme ultraviolet (EUV) light. In one example embodiment, the roughened inner surface of the tube has a surface roughness sufficient to cause grazing incidences of light to be eliminated rather than to be reflected off the roughened inner surface. In one example embodiment, the inner surface of the tube is roughened by bead blasting the inner surface of the tube, and threading the bead-blasted inner surface of the tube.

In one example embodiment, the roughened inner surface of the tube has a surface roughness in a range from about 20 microns to about 1 millimeter. In another example embodiment, the roughened inner surface of the tube has a surface roughness in a range from about 100 microns to about 0.5 millimeter. In yet another example embodiment, the roughened inner surface of the tube has a surface roughness in a range from about 200 microns to about 0.1 millimeter.

Other aspects and advantages of the inventions will become apparent from the following detailed description, taken in conjunction with the accompanying drawings, which illustrate by way of example the principles of the inventions.

DETAILED DESCRIPTION

In the following description, numerous specific details are set forth in order to provide a thorough understanding of the exemplary embodiments. However, it will be apparent to one skilled in the art that the example embodiments may be practiced without some of these specific details. In other instances, process operations and implementation details have not been described in detail, if already well known.

Figure 1:
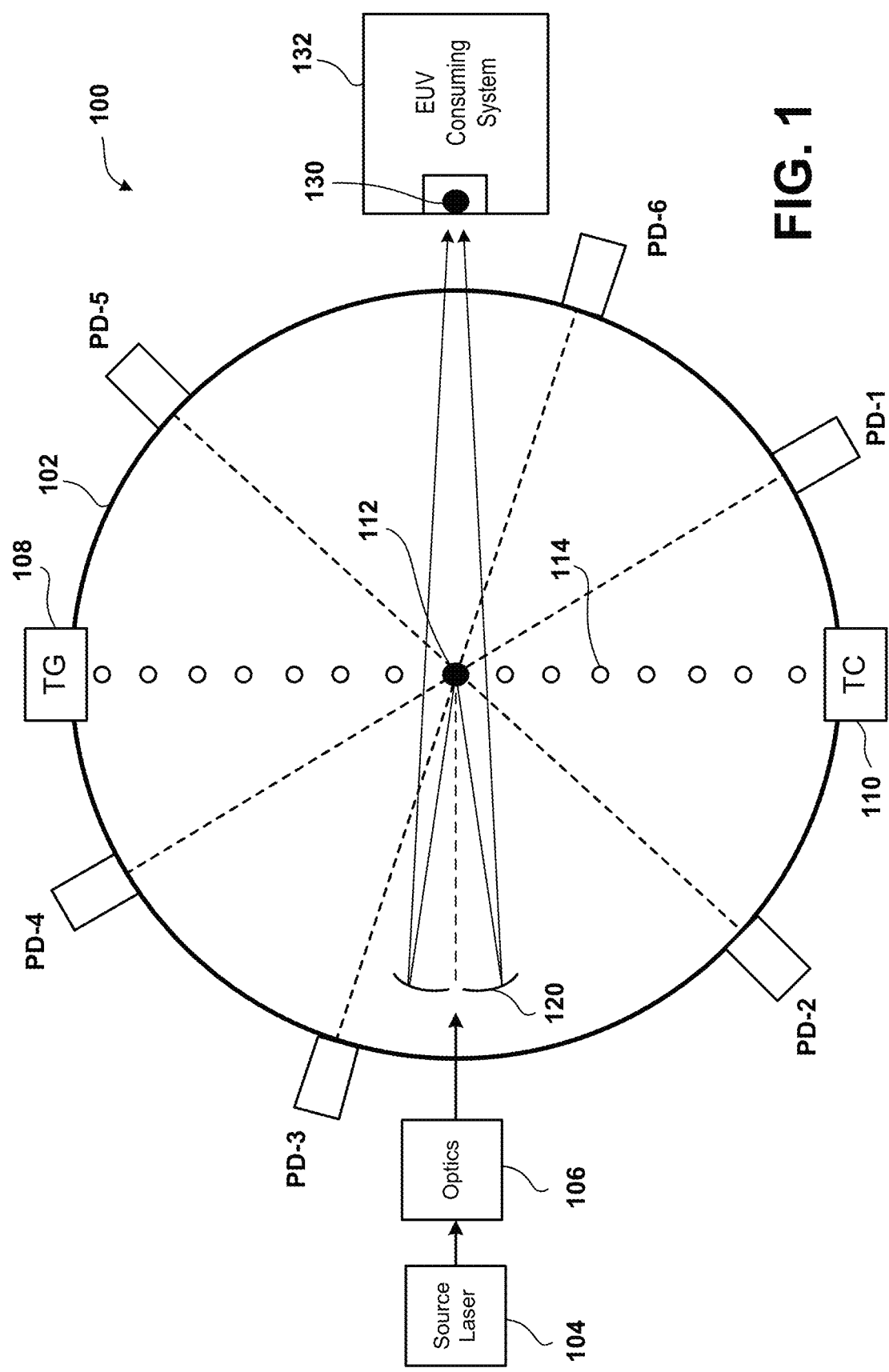
FIG. 1 shows a simplified schematic view of an extreme ultraviolet (EUV) source.

FIG. 1 shows a simplified schematic view of an extreme ultraviolet (EUV) source. As shown in FIG. 1, EUV source 100 includes vessel 102, which defines a light generating chamber. Source laser 104 and optics 106 are situated outside of vessel 102. Source laser can be any suitable laser, e.g., an excimer laser, a deep ultraviolet (DUV) laser, etc. Optics 106, which includes steering and focusing optics, provides a controlled pathway from source laser 104 to vessel 102. Target material generator (TG) 108 generates target material for irradiation by the source laser 104, as will be described in more detail below. As shown in FIG. 1, target material generator 108 generates droplets 114 of target material, e.g., liquid tin. It will be appreciated by those skilled in the art that target material generator 108 also can generate the target material in forms other than droplets. For example, the target material can be generated in the form of a wire, a tape, or a stream. Further, in addition to tin, other suitable target materials, e.g., xenon and lithium, also can be used. Target material catcher (TC) 110 catches the target material that is not irradiated by the source laser. To enable this functionality, the target material catcher 110 is situated on vessel 102 in an opposing relationship relative to target material generator 108.

In operation, target material from target material generator 108 is propelled from the target material generator through irradiation region 112. When the target material is irradiated by the source laser 104 in irradiation region 112, a plasma is generated. Collector 120 disposed within vessel 102 has a reflective surface that collects EUV photons of the plasma and focuses the collected EUV photons out of the vessel to focal point 130, which is the focal point of the collector. The focal point 130 coincides with EUV consuming system 132, which uses the EUV light to perform a function. In one example, UEV consuming system is an EUV lithography system.

To measure the EUV power of the EUV light generated in vessel 102, a number of EUV photodetector (PD) modules are installed on the outside of the vessel. As shown in FIG. 1, six EUV photodetector (PD) modules are disposed around the outside of vessel 102, and these EUV PD modules are labeled as PD-1, PD-2, PD-3, PD-4, PD-5, and PD-6. It should be understood the use of six EUV PD modules is shown by way of example, and that number of EUV PD modules can be varied to be either fewer or more than six to meet the needs of different applications. In one example, two of the EUV PD modules are installed near the top and the bottom of vessel 102, respectively, and the other four EUV PD modules are installed around the side of the vessel. In one example, the top and bottom EUV PD modules are situated on vessel 102 so that they are separated from one another by 180 degrees. In one example, the four side EUV PD modules are placed as symmetric pairs that are separated by 180 degrees. In other words, the side EUV PD modules forming each symmetric pair are located in a diametrically opposing relationship relative to one another. Further, those skilled in the art will appreciate that FIG. 1 shows a projection of a three-dimensional system in two dimensions. Thus, it should be understood that the EUV light path is perpendicular to the plane in which the six EUV PD modules are placed.

Additional details regarding the structure and operation of the EUV PD modules are described below with reference to FIGS. 2 and 3. Those skilled in the art will appreciate that vessel 102 may include additional vessel metrology ports and modules that have been omitted from the simplified schematic view shown in FIG. 1. For example, vessel 102 can be provided with purging sources, vacuum sources, instrumentation for monitoring temperature, a droplet detection module, a droplet illumination module, a nozzle viewing camera, a target material catcher viewing camera, a light emitting diode, etc.

Figure 2:
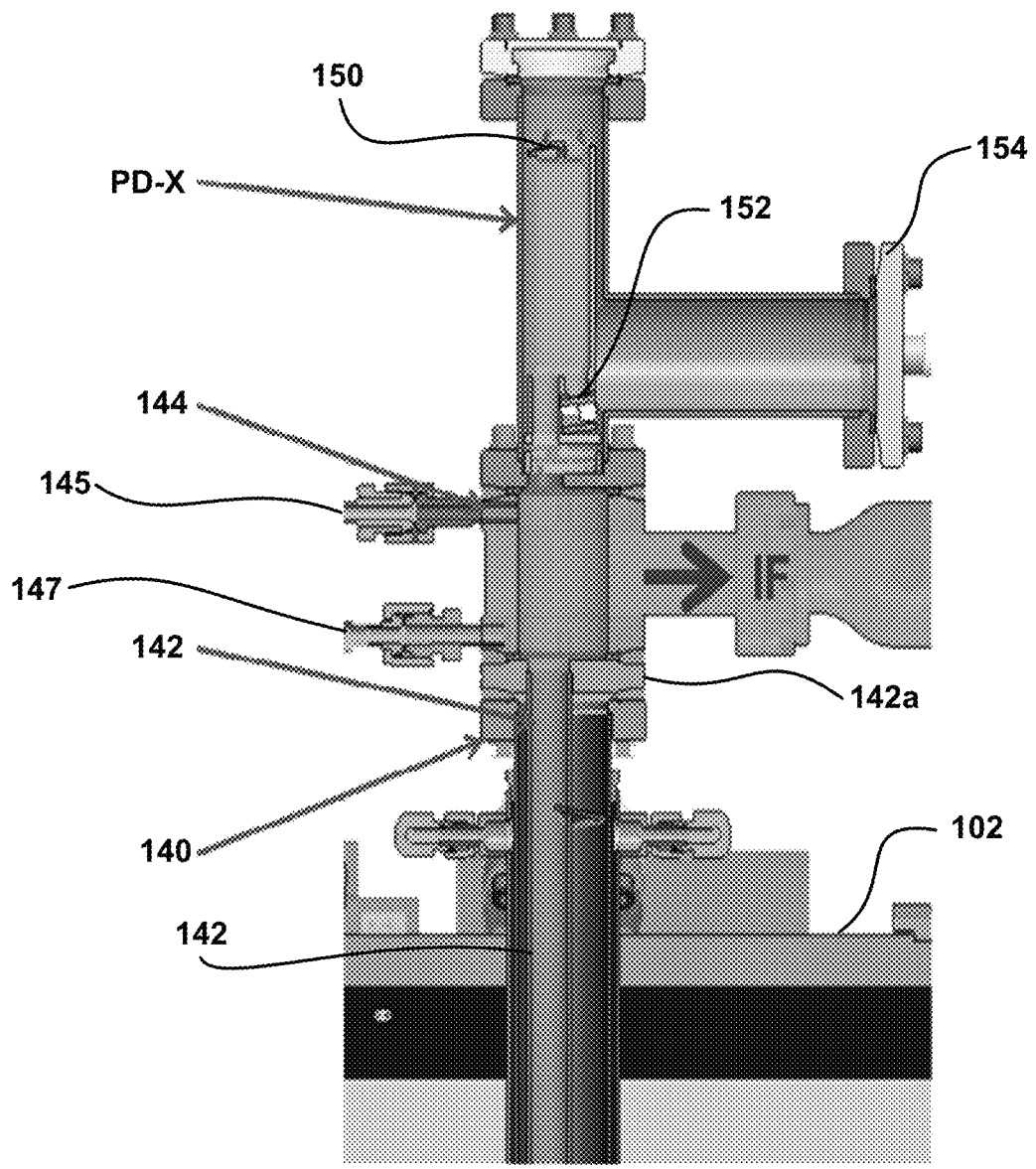
FIG. 2 shows a cross-sectional view of an EUV photodetector (PD) mounted on the vessel of an EUV source.

FIG. 2 shows a cross-sectional view of an EUV PD mounted on the vessel of an EUV source. As shown in FIG. 2, port 140 provides a passageway from the interior of vessel 102 to the exterior of the vessel. Protection tube 142, which is disposed within the passageway defined by port 140, is mounted directly on the port on the vacuum interface. In one example, protection tube 142 includes a flange section 142a that enables the protection tube to be secured in place. The flange section 142a is provided with a number of holes that allow bolts or other suitable fasteners to be used to secure the protection tube 142 in place. Additional details regarding the protection tube 142 and the flange section 142a are described below with reference to FIGS. 4A and 4B.

With continuing reference to FIG. 2, gate valve 144 is mounted on the flange section 142a of protection tube 142. Gate valve 144 is coupled in flow communication with vacuum pump port 145 and gas inlet 147. EUV PD module PD-X is mounted on gate valve 144. EUV PD module PD-X includes a mirror 150 and a sensor 152, the operation of which will be described below with reference to FIG. 3. In one example, sensor 152 is a photodetector. As shown in FIG. 2, the EUV PD module PD-X includes a first part in which mirror 150 and sensor 152 are disposed and a second part which extends from a side of the first part. A connector plate 154 is provided at the end of the second part of EUV PD module PD-X so the EUV PD module can be connected to another structure, e.g., instrumentation, controls, gas purge, vacuum, etc. The EUV PD module PD-X shown in FIG. 2 can be used as the EUV PD modules labeled PD-1, PD-2, PD-3, PD-4, PD-5, and PD-6 in FIG. 1.

Figure 3:
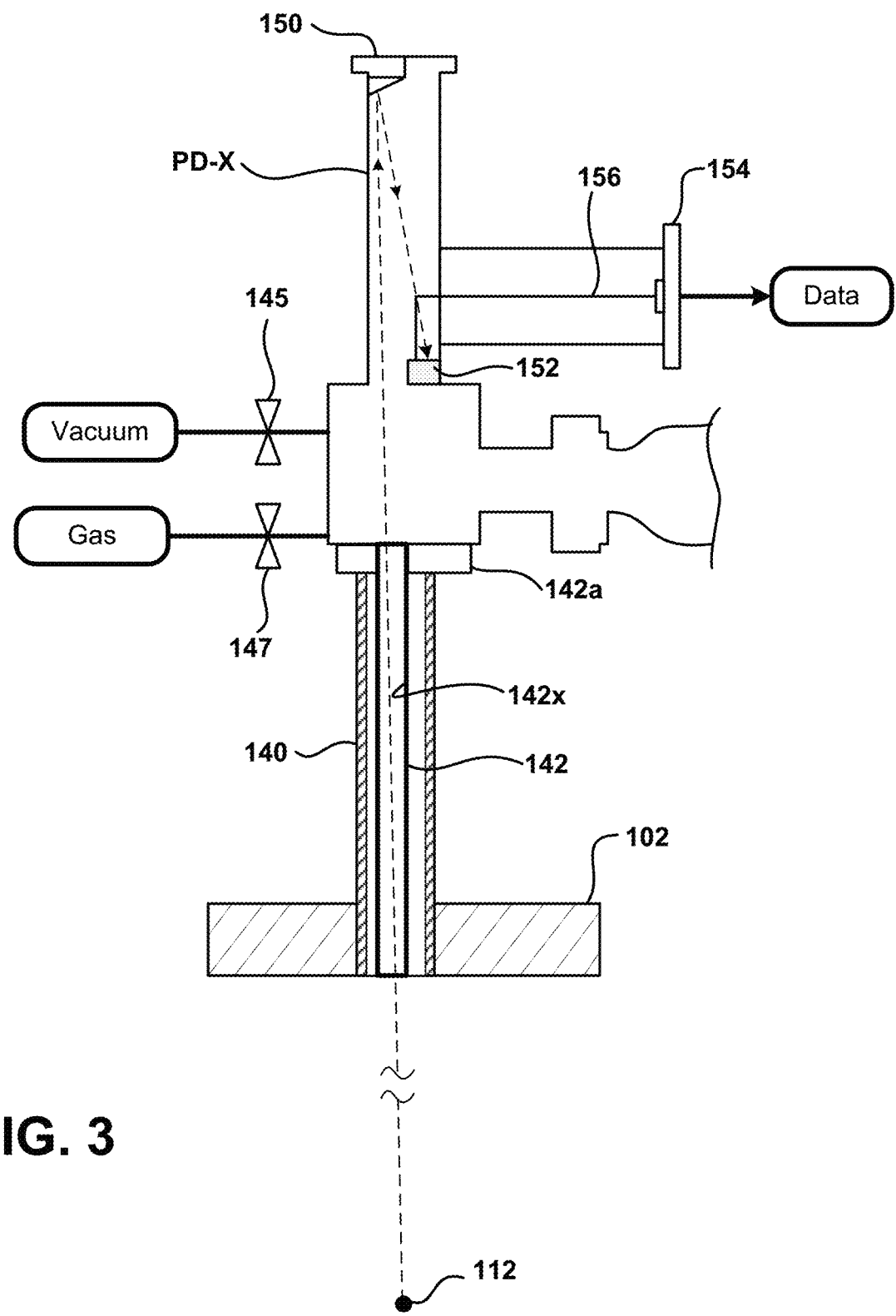
FIG. 3 is a schematic diagram that illustrates the operation of an EUV PD module.

FIG. 3 is a schematic diagram that illustrates the operation of an EUV PD module. As described above, EUV photons are generated in irradiation region 112 when the target material flashes to plasma. These EUV photons disperse in all directions from irradiation region 112. The total amount of the generated EUV photons includes three portions. A first portion of the total amount of the generated EUV photons is collected by the collector (see reference number 120 in FIG. 1) and directed toward the focal point of the collector (see reference number 130 in FIG. 1). A second portion of the total amount of the generated EUV photons is collected by the EUV PD modules disposed around the exterior of the vessel, with the second portion being proportional to the total amount of the generated EUV photons. The third portion of the total amount of the generated EUV photons is dispersed throughout the light generating chamber. The dotted line shown in FIG. 3 indicates the path followed by the EUV photons into EUV PD module PD-X. As shown in FIG. 3, the EUV photons exit vessel 102 via protection tube 142, which is disposed within the wall defining port 140. The EUV photons propagate in the protection tube 142 and fill the space within the protection tube. The EUV photons that do not propagate directly through protection tube 142 reflect off the inner wall 144x of the protection tube, as will be discussed in more detail below.

From the protection tube 142, the EUV photons propagate to the mirror 150 in EUV PD module PD-X. The mirror 150, which, as shown in FIG. 3, is located in the upper left corner of EUV PD module PD-X, reflects the EUV photons toward the lower right corner of the EUV PD module in which sensor 152 is disposed. The EUV light energy detected by sensor 152 is transmitted from the sensor by wire 156, which extends from the sensor to the end of EUV PD module PD-X at which connector plate 154 is disposed.

Figure 4A:
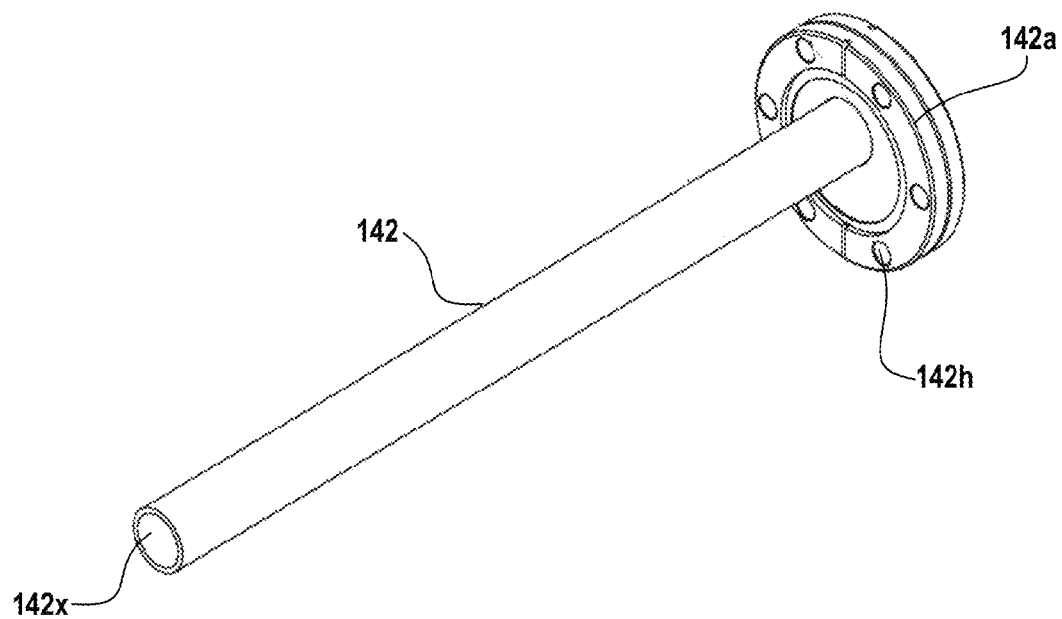
FIG. 4A is an isometric view of a protection tube that shows additional details of the protection tube, in accordance with one embodiment of the invention.

FIG. 4A is an isometric view of a protection tube that shows additional details of the protection tube. As shown in FIG. 4A, protection tube 142 has a cylindrical configuration and includes a flange section 142a at one end thereof. The flange section 142a includes six (6) holes 142h that enable protection tube 142 to be secured in place with suitable fasteners, e.g., bolts, screws, etc. It will be appreciated by those skilled in the art that the number of holes in the flange section can be varied to suit the needs of particular situations. For example, flange section 142a can be provided with three (3) holes, four (4) holes, five (5) holes, etc. Inner wall 142x defines the hollow space within protection tube 142. Protection tube 142 can be made of any suitable metallic material. In one example, protection tube 142 is made of stainless steel, e.g. Type 304, Type 304L, Type TP316L stainless steel, etc. The protection tube 142 can be either a seamless cylindrical tube formed by, e.g., cold drawing, or a cylindrical tube formed by welding.

Figure 4B:
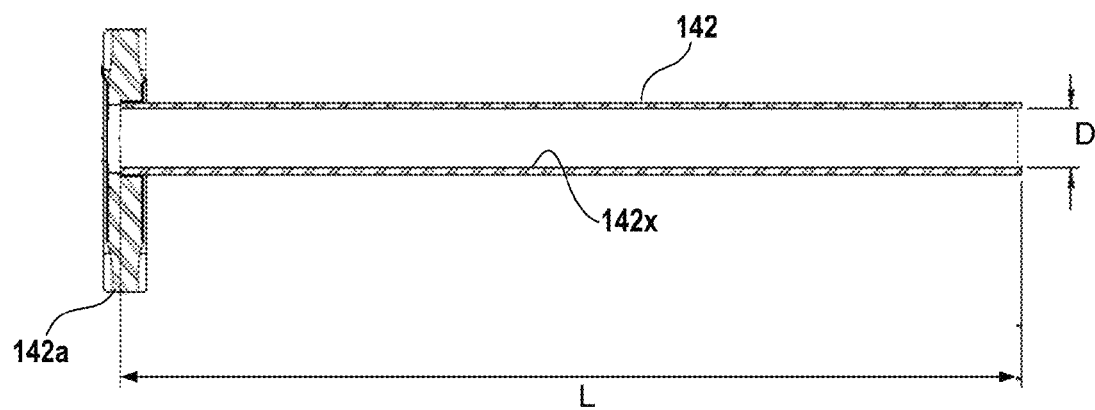
FIG. 4B is a cross-sectional view of a protection tube that shows additional details of the protection tube, in accordance with one embodiment of the invention.

FIG. 4B is a cross-sectional view of a protection tube that shows additional details of the protection tube. As shown in FIG. 4B, the cylindrical tube section of protection tube 142 has a length L and a diameter D. It will be appreciated by those skilled in the art that the length L and diameter D of the cylindrical tube section of protection tube 142 can be varied to suit the needs of particular situations. In one particular example, the length L is about 273 mm and the diameter D is about 15 mm. As used herein, the term "about" means that the specified parameter can be varied within a tolerance range of ±25%. The flange section 142a is joined to the cylindrical tube section of protection tube 142 so that a portion of the cylindrical tube section is embedded in the flange section. In one example, about 5 mm to about 10 mm of the cylindrical tube section is embedded in the cylindrical tube section. The flange section 142a can be joined to the cylindrical tube section using any suitable joining technique, e.g., welding, etc.

During operation of an EUV source having six EUV PD modules as shown in the example of FIG. 1, significant EUV energy discrepancy was observed between the sensors (photodetectors) of these EUV PD modules. It was initially believed that reflections off the inner wall of the protection tube for EUV photons at grazing incidence to the inner wall of the tube (a small angle relative to the inner wall surface) would not be a significant factor in the observed energy discrepancy, as the roughness of the inner wall surface of the protection tubes being used (about 200 nm) was approximately 15 times greater than the wavelength of the EUV light (13.5 nm). Thus, it was initially believed that the EUV light contacting the inner wall surface of the protection tube at grazing incidence would be eliminated rather than reflected and therefore would not end up reaching the sensor of an EUV PD module. However, as will be explained in more detail below, it was unexpectedly determined in a subsequent investigation that grazing incidence reflections were indeed a major contributor to EUV energy discrepancy observed between the sensors of the EUV PD modules.

The complex refractive index of materials for EUV wavelengths leads to total external reflection at the vacuum-material interface. This implies that as the angle of incidence approaches the critical angle of incidence (the angle of total external reflection), the reflectivity of the material surface increases sharply. For small angles of incidence relative to the inner wall of the stainless steel protection tube, a considerable amount of the EUV light will be reflected. In other words, the inner wall surface of the protection tube may work as a channeling guide for EUV light. The amount of EUV light channeled toward the sensor of an EUV PD module will depend on the geometry of the setup, including, by way of example, the diameter and length of the protection tube, the EUV collection solid angle, and the distance from the protection tube to the sensor (photodetector) of the EUV PD module. The reflectivity of the surface also depends on the surface flatness for a given wavelength of incident light and increases for decreasing surface roughness. In the case of EUV light, a surface roughness on the order of the wavelength, 13.5 nm, would be expected for efficient reflection. However, as noted above, discrepancy between EUV PD modules was found when protection tubes having a surface roughness on the order of 200 nm, which is about 15× larger than the EUV wavelength, were used.

Grazing incidence reflections off the inner wall surface of the protection tube along the length of the cylindrical wall result in higher than normal EUV energy measurements because such reflections effectively channel EUV light toward the sensor of an EUV PD module. The presence of grazing incidence reflections can be verified by observing the "hot spots" created on the detection surface. In an effort to solve the problem of grazing incidence reflections off the inner wall surface of a protection tube having a surface roughness of about 200 nm, EUV power measurements were taken during operation of an EUV source having protection tubes with a roughened inner wall surface. In this investigation, the inner wall surface of the protection tubes was roughened using two different roughening techniques. In a first operation, the inner wall surface of the protection tube was bead blasted. In a second operation, the bead-blasted inner wall surface was threaded. The resulting roughened inner wall surface of the protection tube was too coarse for measuring the surface figure. As such, it was necessary to estimate the surface figure, as explained in more detail below.

Figure 5:
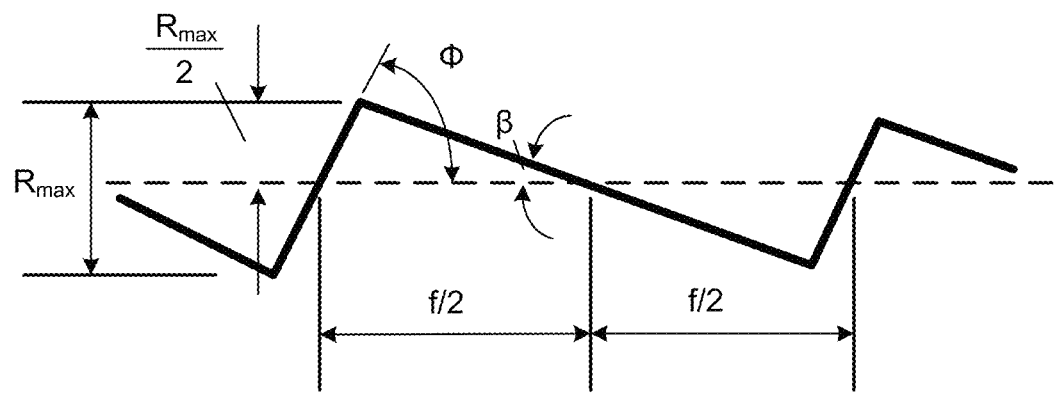
FIG. 5 illustrates an ideal model for surface roughness.

Roughness produced by machining can be characterized as a combination of two independent quantities: (i) ideal roughness (ISR); and (ii) natural roughness. Ideal roughness (ISR) is a function of feed and geometry. ISR is the best possible finish obtainable for a given tool shape and feed. When calculating ISR, all inaccuracies of the machine tool are neglected. For a sharp tool without a nose radius, the maximum height of unevenness is given as: Rmax=f/(cot φ+cot β), where, as shown in FIG. 5, "f" is the feed, "φ" is the major cutting edge angle, and "β" is the working minor cutting edge angle. The surface roughness value is Rmax/4. In a real situation, Ra=0.0321($f^2$/r), where "r" is the corner radius.

In the case of the roughened protection tubes used in the investigation, an 11/16 fine thread was used to as part of the surface roughening process. The 11/16 fine thread has a feed of 0.0625 inch. According to the tool supplier, the corner radius ("r") is 0.01 inch, so the surface roughness formula Ra=0.0321($f^2$/r) yields a value of 318 μm (microns). As discussed above, the surface roughness of the inner wall surface of the original (non-roughened) protection tubes used when the EUV power discrepancy was observed was about 200 nm (nanometers). Thus, the inner wall surface that was roughened by bead blasting and threading has a surface roughness that is more than 1,000 times larger than the surface roughness of the original protection tubes.

Figure 6A:
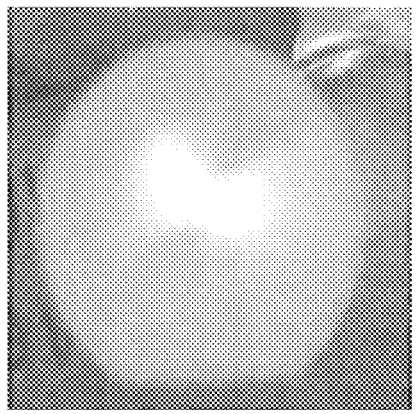
FIG. 6A is a photograph of a fluorescent screen when the beam of EUV photons was passed through the original (non-roughened) protection tube before reaching the screen.
Figure 6B:
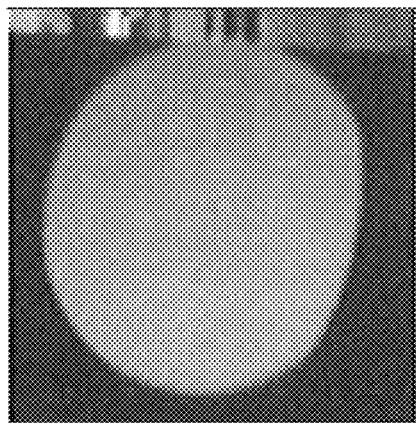
FIG. 6B is a photograph of the fluorescent screen when the beam of EUV photons was passed through the roughened protection tube before reaching the screen.

In tests conducted using the roughened protection tube and the original (non-roughened) protection tube, the roughened protection tube was found to minimize or essentially eliminate the contribution to EUV energy from grazing incidence reflections off the inner surface of the protection tube. In these tests a special EUV PD module was substituted for one of the other EUV PD modules. This EUV PD module included a Ce:YAG fluorescent screen on the port of the EUV PD module. The fluorescent screen has a Zr outer layer to filter out-of-band emission from the plasma. Thus, in the tests, the beam of EUV photons generated in the light generating chamber (vessel) was directly incident on the fluorescent screen. FIG. 6A is a photograph of the fluorescent screen when the beam of EUV photons was passed through the original protection tube before reaching the screen. As can be seen in FIG. 6A, there is a white area in the middle of the screen. This white area is a "hot spot" that indicates grazing incidence reflections off the inner surface of the original protection tube contribute to the higher intensity in the middle of the screen. FIG. 6B is a photograph of the fluorescent screen when the beam of EUV photons was passed through the roughened protection tube before reaching the screen. As can be seen in FIG. 6B, there is no "hot spot" in the middle of the screen. Thus, the roughened protection tube has essentially eliminated the contribution of grazing incidence effects and the intensity of light is substantially uniform across the screen (as indicated by the uniform appearance of the screen that can be seen in FIG. 6B).

Figure 7:
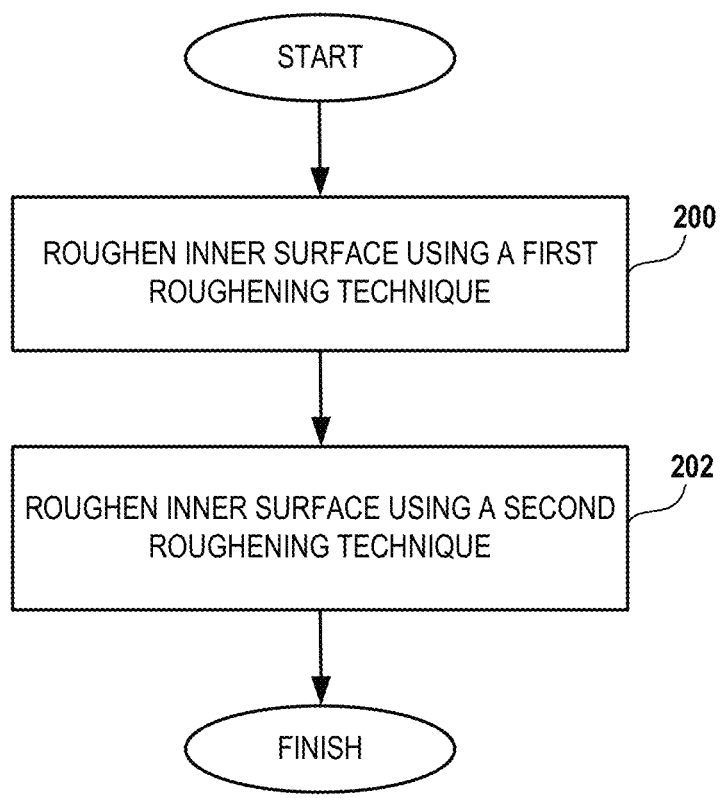
FIG. 7 is a flowchart diagram illustrating the method operations that can be used to roughen the inner surface of a protection tube, in accordance with one embodiment of the invention.

FIG. 7 is a flowchart diagram illustrating the method operations that can be used to roughen the inner surface of a protection tube, in accordance with one embodiment of the invention. In operation 200, the inner surface of the protection tube is roughened using a first roughening technique. The inner surface 142x of protection tube 142 (see FIGS. 3, 4A, and 4B) can be roughened using any suitable roughening technique. For example, the inner surface can be roughened using a media blasting technique, e.g., bead blasting, sandblasting, powder blasting, etc. The inner surface also can be roughened using a chemical technique, e.g., chemical etching, or a metal cutting technique, e.g., threading, milling, etc. Still further, the inner surface can be roughened using an abrasive technique, e.g., sanding, grinding, honing, electro-polishing, etc. As grazing incidence reflections can occur over the entirety of the inner surface of the protection tube, the roughening technique should be implemented in a manner that ensures that the entirety of the inner surface will be roughened. In a case where the protection tube is situated so that grazing incidence reflections are not expected to occur over the entirety of the inner surface of the tube, it might be sufficient to roughen only the portion (or portions) of the tube where grazing incidence reflections are expected to occur.

In operation 202, the inner surface of the protection tube is roughened using a second roughening technique. The second roughening technique can be either the same as or different from the first roughening technique used in operation 200. As such, any of the roughening techniques referred to above in connection with operation 200 also can be used in operation 202. Further, the use of the second roughening technique is optional and can be omitted if the first roughening technique used in operation 200 yields a roughened inner surface that is sufficient to minimize or essentially eliminate the effects of grazing incidence reflections.

In one example, the inner surface of the protection tube was roughened by bead blasting in a first roughening process, and then was further roughened by threading the bead-blasted inner surface of the protection tube in a second roughening process. The use of bead blasting as the first roughening technique ensures that the entire inner surface has been roughened to some degree. This would not be the case if the inner surface of the protection tube was roughened only by threading because portions of the threaded inner surface, e.g., the tops of the individual threads and the valley regions between the individual threads, might still be relatively smooth. As such, grazing incidences of light might reflect off these relatively smooth surfaces. That said, depending on the configuration of the threads and the size of the protection tube, roughening the inner surface of the protection tube using only threading might well be sufficient to minimize or essentially eliminate the effects of grazing incidence reflections.

The degree to which the inner surface of the protection tube is roughened should to sufficient to cause grazing incidences of light to be eliminated rather than to be reflected off the inner surface. As discussed above, grazing incidence reflections occurred when the inner surface of the protection tube had a surface roughness of about 200 nanometers but did not occur significantly when the inner surface had a surface roughness on the order of 300 microns. The surface roughness of 300 microns is over 1,000 times larger than the surface roughness of 200 nanometers; however, it is believed that such a large increase in the surface roughness is not required to eliminate grazing incidences of EUV light off the inner surface. Instead, it is believed that a surface roughness that is about 100 times larger than the original surface roughness of 200 nanometers should be sufficient to cause grazing incidences of light to be eliminated. Thus, in one example, the inner surface of the protection tube is roughened so as to have a surface roughness that is in the range from about 20 microns to about 1 mm (millimeter). The upper limit for the surface roughness is limited only by the degree of roughness that can be practically implemented in a protection tube having the thickness on the order of those used in connection with light generating chambers.

In another example, the inner surface of the protection tube is roughened so as to have a surface roughness in the range from about 50 microns to about 0.5 millimeter. In yet another example, the inner surface of the protection tube is roughened so as to have a surface roughness in the range from about 100 microns to about 0.5 millimeter. In a further example, the inner surface of the protection tube is roughened so as to have a surface roughness in the range from about 200 microns to about 0.1 millimeter.

Figure 8:
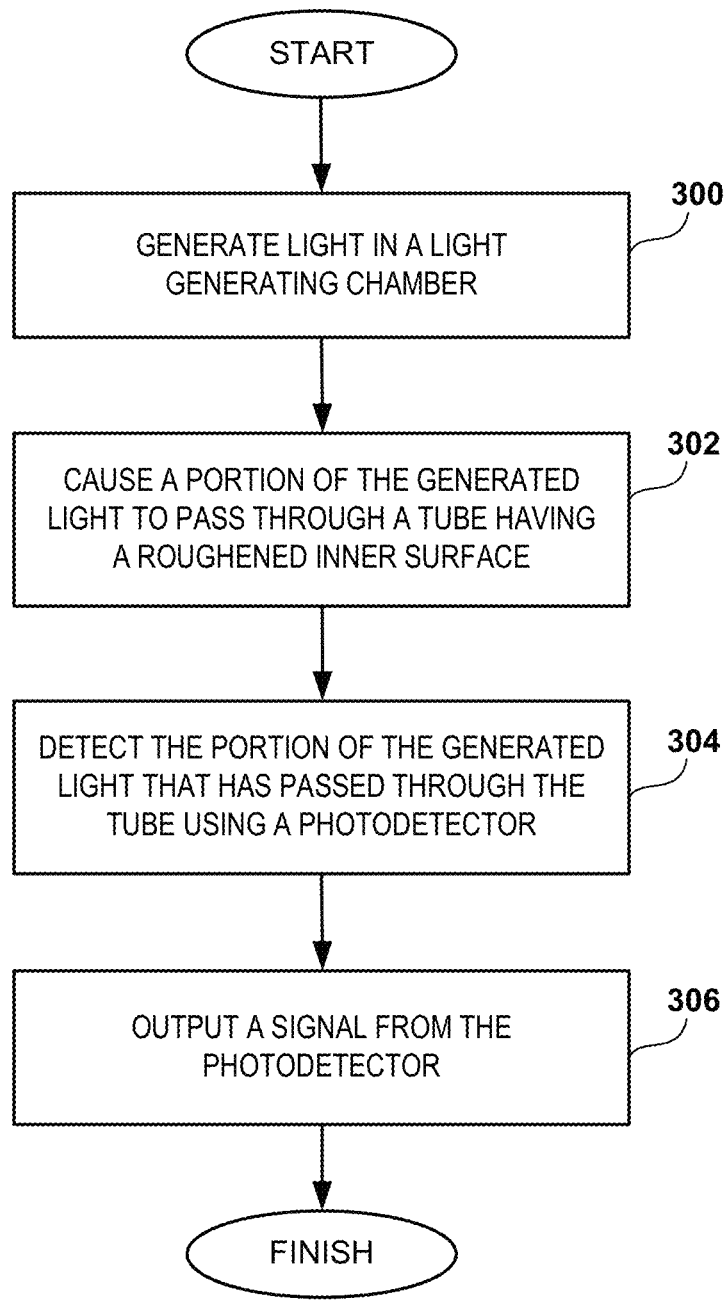
FIG. 8 is a flowchart diagram illustrating the method operations used to generate light, in accordance with one embodiment of the invention.

FIG. 8 is a flowchart diagram illustrating the method operations that can be used to generate light, in accordance with one embodiment of the invention. In operation 300, light is generated in a light generating chamber. The light can be generated in any suitable light generating chamber, e.g., vessel 102 described above with reference to FIG. 1. The light generated in the light generating chamber shown in FIG. 1 is EUV light; however, it will be appreciated by those skilled in the art that the method is applicable to any wavelength of light. In operation 302, a portion of the light is caused to pass through a tube having a roughened inner surface. As described above, a portion of the EUV photons generated in vessel 102 shown in FIG. 1 is detected by the EUV PD modules disposed external to the vessel. The generated EUV photons can be caused to pass through a tube, e.g., protection tube 142 shown in FIGS. 2 and 3, by disposing the tube between the irradiation region 112 (see FIG. 1) and an EUV PD module, e.g., EUV PD module PD-X shown in FIGS. 2 and 3. The inner surface of the tube can be roughened using any suitable roughening technique, e.g., the method operations described with reference to FIG. 7. The inner surface of the tube should be roughened to a degree that is sufficient to cause grazing incidences of light to be eliminated rather than to be reflected off the inner surface of the tube, as previously described.

In operation 304, the portion of the generated light that has passed through the tube is detected using a photodetector. In the examples shown in FIGS. 1-3, the portion of the generated light (EUV photons) that has passed through the protection tube is detected by EUV PD modules, each of which includes a sensor 152, which can be a photodetector. The photodetector can be implemented using any configuration suitable for detecting the generated light that has passed through the tube. As such, it will be appreciated by those skilled in the art that the method of generating light can be implemented without using the particular EUV PD modules described herein. In operation 306, a signal is output from the photodetector to a controller or other device, e.g., a consuming system, a computer, memory, storage, and/or a monitoring computer. The signal corresponds to the portion of the generated light detected by the photodetector. The controller can quantify the signal using appropriate software and/or hardware to determine the amount of the detected portion of the generated light. Based on this determination, the controller can cause any necessary adjustments to be made to the parameters associated with generating light in the light generating chamber. By way of example, the controller can adjust one or more of the following parameters: the timing of the source laser; the power/amplification of the source laser; the optics of the source laser, e.g., the focusing and the steering of the laser; the steering of the target material; and the timing of the target material. Once the signal has been output from the photodetector to the controller, the method is finished.

Figure 9:
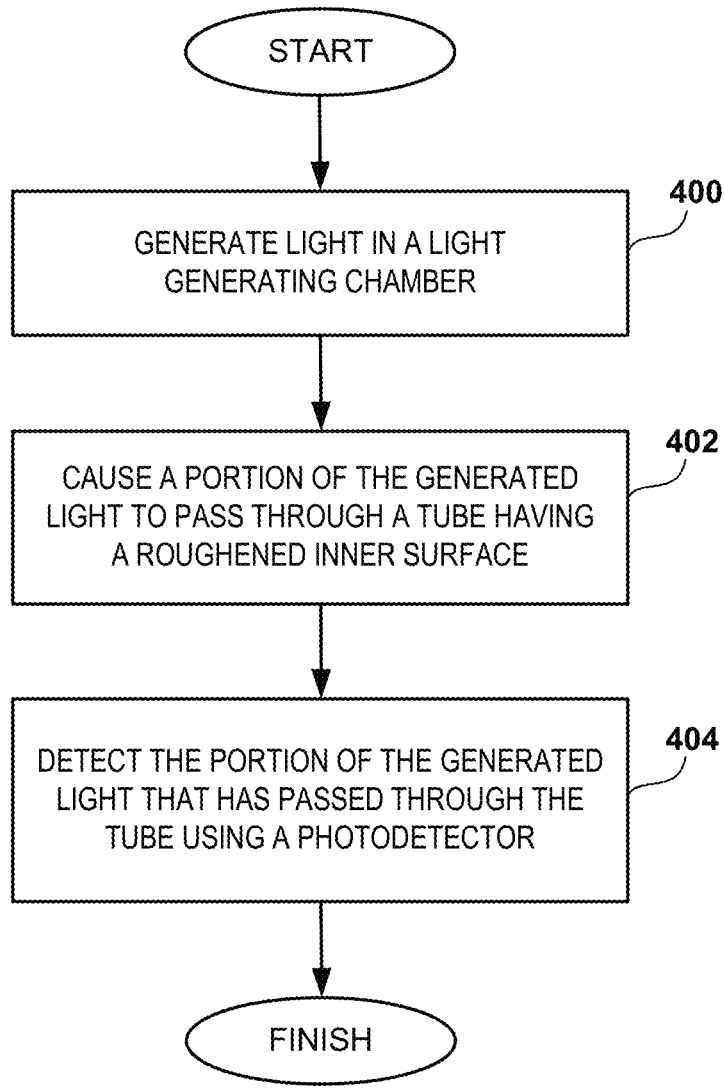
FIG. 9 is a flowchart diagram illustrating the method operations used to measure light energy, in accordance with one embodiment of the invention.

FIG. 9 is a flowchart diagram illustrating the method operations that can be used to measure light energy, in accordance with one embodiment of the invention. In operation 400, light is generated in a light generating chamber. The light can be generated in any suitable light generating chamber, e.g., vessel 102 described above with reference to FIG. 1. The light generated in the light generating chamber shown in FIG. 1 is EUV light; however, it will be appreciated by those skilled in the art that the method is applicable to any wavelength of light. In operation 402, a portion of the light is caused to pass through a tube having a roughened inner surface. As described above, a portion of the EUV photons generated in vessel 102 shown in FIG. 1 is collected in the EUV PD modules disposed external to the vessel. The generated EUV photons can be caused to pass through a tube, e.g., protection tube 142 shown in FIGS. 2 and 3, by disposing the tube between the irradiation region 112 (see FIG. 1) and an EUV PD module, e.g., EUV PD module PD-X shown in FIGS. 2 and 3. The inner surface of the tube can be roughened using any suitable roughening technique, e.g., the method operations described with reference to FIG. 7. The inner surface of the tube should be roughened to a degree that is sufficient to cause grazing incidences of light to be eliminated rather than to be reflected off the inner surface of the tube, as previously described.

In operation 404, the portion of the generated light that has passed through the tube is detected using a photodetector. The photodetector generates a signal corresponding to the portion of the generated light detected by the photodetector. The signal can be output directly to an indicator or other suitable display device and/or output to a processing device, e.g., a controller. In the examples shown in FIGS. 1-3, the portion of the generated light (EUV photons) that has passed through the protection tube is detected by EUV PD modules, each of which includes a sensor 152, which can be a photodetector. The photodetector can be implemented using any configuration suitable for detecting the generated light that has passed through the tube. As such, it will be appreciated by those skilled in the art that the method of measuring light energy can be implemented without using the particular EUV PD modules described herein. Once the portion of the generated light that has passed through the tube has been detected, the method is finished.

Accordingly, the disclosure of the example embodiments is intended to be illustrative, but not limiting, of the scope of the inventions, which are set forth in the following claims and their equivalents. Although example embodiments of the inventions have been described in some detail for purposes of clarity of understanding, it will be apparent that certain changes and modifications can be practiced within the scope of the following claims. In the following claims, elements and/or steps do not imply any particular order of operation, unless explicitly stated in the claims or implicitly required by the disclosure.

What is claimed is:

1. A light source, comprising:
   a light generating chamber;
   a collector having a reflective surface disposed in the light generating chamber;
   a target material generator configured to propel a quantity of target material toward an irradiation region disposed in front of the reflective surface of the collector;
   a plurality of photodetector modules disposed external to the light generating chamber, each of the plurality of photodetector modules being directed toward the irradiation region; and
   a plurality of tubes each having a centerline directed toward the irradiation region, each of the tubes being disposed between a corresponding photodetector module and the irradiation region, and each of the plurality of tubes has a roughened inner surface.

2. The light source of claim 1, wherein the light generating chamber is configured to generate extreme ultraviolet (EUV) light.

3. The light source of claim 1, wherein the roughened inner surface of each of the plurality of tubes has a surface roughness sufficient to cause grazing incidences of light to be eliminated rather than to be reflected off the roughened inner surface.

4. The light source of claim 1, wherein the inner surface of each of the plurality of tubes is roughened by bead blasting the inner surface of each of the plurality of tubes, and threading the bead-blasted inner surface of each of the plurality of tubes.

5. The light source of claim 1, wherein the roughened inner surface of each of the plurality of tubes has a surface roughness in a range from about 20 microns to about 1 millimeter.

6. The light source of claim 1, wherein the roughened inner surface of each of the plurality of tubes has a surface roughness in a range from about 100 microns to about 0.5 millimeter.

7. The light source of claim 1, wherein the roughened inner surface of each of the plurality of tubes has a surface roughness in a range from about 200 microns to about 0.1 millimeter.

8. The light source of claim 1, wherein the inner surface of each of the plurality of tubes is roughened by bead blasting the inner surface of each of the plurality of tubes, and threading the bead-blasted inner surface of each of the plurality of tubes, and wherein the roughened inner surface of each of the plurality of tubes has a surface roughness in a range from about 20 microns to about 1 millimeter.

9. The light source of claim 1, wherein the inner surface of each of the plurality of tubes is roughened by bead blasting the inner surface of each of the plurality of tubes, and threading the bead-blasted inner surface of each of the plurality of tubes, and wherein the roughened inner surface of each of the plurality of tubes has a surface roughness in a range from about 100 microns to about 0.5 millimeter.

10. The light source of claim 1, wherein the inner surface of each of the plurality of tubes is roughened by bead blasting the inner surface of each of the plurality of tubes, and threading the bead-blasted inner surface of each of the plurality of tubes, and wherein the roughened inner surface of each of the plurality of tubes has a surface roughness in a range from about 20 microns to about 0.1 millimeter.

11. A light source, comprising:
a light generating chamber configured to generate extreme ultraviolet (EUV) light;
a collector having a reflective surface disposed in the light generating chamber;
a target material generator configured to propel a quantity of target material toward an irradiation region disposed in front of the reflective surface of the collector;
a plurality of photodetector modules disposed external to the light generating chamber, each of the plurality of photodetector modules being directed toward the irradiation region; and
a plurality of tubes each having a centerline directed toward the irradiation region, each of the tubes being disposed between a corresponding photodetector module and the irradiation region, each of the plurality of tubes has a roughened inner surface, and the roughened inner surface of each of the plurality of tubes has a surface roughness in a range from about 20 microns to about 1 millimeter.

12. The light source of claim 11, wherein the roughened inner surface of each of the plurality of tubes has a surface roughness in a range from about 100 microns to about 0.5 millimeter.

13. The light source of claim 11, wherein the roughened inner surface of each of the plurality of tubes has a surface roughness in a range from about 200 microns to about 0.1 millimeter.

14. The light source of claim 11, wherein the inner surface of each of the plurality of tubes is roughened by bead blasting the inner surface of each of the plurality of tubes, and threading the bead-blasted inner surface of each of the plurality of tubes.

15. The light source of claim 12, wherein the inner surface of each of the plurality of tubes is roughened by bead blasting the inner surface of each of the plurality of tubes, and threading the bead-blasted inner surface of each of the plurality of tubes.

16. The light source of claim 13, wherein the inner surface of each of the plurality of tubes is roughened by bead blasting the inner surface of each of the plurality of tubes, and threading the bead-blasted inner surface of each of the plurality of tubes.

17. A light source, comprising:
a light generating chamber configured to generate extreme ultraviolet (EUV) light;
a collector having a reflective surface disposed in the light generating chamber;
a target material generator configured to propel a quantity of target material toward an irradiation region disposed in front of the reflective surface of the collector;
a plurality of photodetector modules disposed external to the light generating chamber, each of the plurality of photodetector modules being directed toward the irradiation region; and
a plurality of tubes each having a centerline directed toward the irradiation region, each of the tubes being disposed between a corresponding photodetector module and the irradiation region, each of the plurality of tubes has a roughened inner surface, and the inner surface of each of the plurality of tubes being roughened by bead blasting the inner surface of each of the plurality of tubes, and threading the bead-blasted inner surface of each of the plurality of tubes.

18. The light source of claim 17, wherein the roughened inner surface of each of the plurality of tubes has a surface roughness sufficient to cause grazing incidences of light to be eliminated rather than to be reflected off the roughened inner surface.

19. The light source of claim 17, wherein the roughened inner surface of each of the plurality of tubes has a surface roughness in a range from about 20 microns to about 1 millimeter.

20. The light source of claim 17, wherein the roughened inner surface of each of the plurality of tubes has a surface roughness in a range from about 100 microns to about 0.5 millimeter.

21. The light source of claim 17, wherein the roughened inner surface of each of the plurality of tubes has a surface roughness in a range from about 200 microns to about 0.1 millimeter.

* * * * *